United States Patent [19]

van de Ven et al.

[11] Patent Number: 4,566,177
[45] Date of Patent: Jan. 28, 1986

[54] FORMATION OF ELECTROMIGRATION RESISTANT ALUMINUM ALLOY CONDUCTORS

[75] Inventors: Everhardus P. G. T. van de Ven, Muko, Japan; Janet M. Towner, Palo Alto, Calif.

[73] Assignee: Signetics Corporation, Sunnyvale, Calif.

[21] Appl. No.: 609,268

[22] Filed: May 11, 1984

[51] Int. Cl.⁴ .................. H01L 21/324; H01L 21/477
[52] U.S. Cl. ........................................ 29/590; 29/578; 148/1.5; 148/188; 148/13; 148/13.1; 357/67; 427/90
[58] Field of Search ................ 29/571, 576 T, 578, 29/584, 590; 148/1.5, 187, 188, 13, 13.1; 357/67; 427/88, 90

[56] References Cited

U.S. PATENT DOCUMENTS

| | | | |
|---|---|---|---|
| 3,848,330 | 11/1974 | Hall et al. | 29/590 |
| 4,062,720 | 12/1977 | Alcorn et al. | 29/590 X |
| 4,154,874 | 5/1979 | Howard et al. | 29/578 X |
| 4,331,485 | 5/1982 | Gat | 29/576 T X |
| 4,352,239 | 10/1982 | Pierce | 29/590 |

*Primary Examiner*—Brian E. Hearn
*Assistant Examiner*—David A. Hey
*Attorney, Agent, or Firm*—Norman N. Spain

[57] ABSTRACT

Electromigration resistance of aluminum alloy conductors in semiconductor devices is found to significantly increase by rapidly annealing the conductors by employing an annealing cycle with a peak temperature of 520°–580° C. and a cycle time of about 5 to 30 seconds such as is developed by high intensity CW lamps.

15 Claims, 3 Drawing Figures

⊢————⊣ 10 μm

FORMATION OF ELECTROMIGRATION RESISTANT ALUMINUM ALLOY CONDUCTORS

BACKGROUND OF THE INVENTION

This invention relates to a method for the formation of electromigration resistant aluminum alloy conductors in semiconductor devices.

As is well known, electromigration in aluminum alloy conductors frequently is a cause of failure in high density integrated circuits. As a result of the electromigration, which occurs particularly under high DC current and high temperature conditions which occur very frequently in the operation of semiconductor devices, aluminum metal is transported by the current flowing through aluminum alloy containing conductors thereby causing the aluminum metal to form voids in certain areas and excess deposits in other areas. Because of this, the resistances of contacts in such devices are caused to increase to such an extent that there is an excessive amount of resistive heating resulting in the premature failure of the devices.

Various methods of increasing the electromigration resistance of aluminum alloy conductors have been attempted.

It has been found that the improvement in the lifetime was observed for the conductors consisting of a chain of (111) oriented Al single crystals. Such a "bamboo" structure has been obtained by for example by annealing semiconductive conductors consisting of a Al-0.5% Cu alloy at 450° C. for 30 minutes. By use of this technique, described in Gat U.S. Pat. No. 4,331,485 increased lifetimes have been reported for conductors up to 4 $\mu$m wide. Similarly, Pierce U.S. Pat. No. 4,352,239 shows a method of suppressing electromigration in aluminum conductors in semiconductor devices by heating the conductors to 480° C. for about 50 minutes. However, these methods are considered to be too time consuming to be economically feasible.

In Howard et al U.S. Pat. No. 4,154,874 an increase in the resistance to electromigration was found when aluminum and a transition metal were co-deposited upon a supporting body at a very low pressure and in a substantially oxygen-free vacuum and the resultant body was then annealed at a temperature between about 200° C. and 525° C. for a time sufficient to form a region containing aluminum and transition metal compounds within the aluminum stripe. The specific minimum annealing time shown being 3 hours. This method has successfully been employed in suppressing electromigration but suffers from the defects of requiring a long annealing time and also requiring the presence of a transition metal such as titanium, zirconium, hafnium as well as other transition metals which tend to increase the cost of the device.

An additional method of reducing susceptibility of aluminum alloy semiconductor conductors to electromigration is that shown in Hall et al U.S. Pat. No. 3,848,330. According to the method of this patent aluminum alloy conductors containing a small percentage of copper are formed on a semiconductor device by evaporation techniques after which the device is heated to a temperature greater than 400° C., particularly between 425° to 475° C., to alloy the copper into the aluminum and is then quickly cooled at a rate of at least 50° C. per second to precipitate copper-rich $A_2Cu$ precipitates out of the solution to form a fine grain structure having aluminum grains and grains of copper-rich precipitates interdispersed between the aluminum grains along the grain boundaries and triple points thereof. This approach in which there is no formation of large grains has not proved too successful in reducing electromigration nor can it be used for preventing electromigration in aluminum conductors containing no copper.

BRIEF SUMMARY OF THE INVENTION

A principal object of this invention is to provide a more efficient method of providing a semiconductor device with aluminum alloy conductors of improved electromigration resistance.

These and other objects of the invention will become apparent from the description of the invention that follows.

According to the invention, it has been found that the electromigration tendency of aluminum alloy conductors may be significantly reduced by heating these conductors to a peak temperature of 520° C. to 580° C. from the ambient temperature and cooling the heated conductors to ambient temperature all within 5 to 30 seconds. This is achieved by exposing a substrate bearing the aluminum alloy conductors or a layer thereof to a source of heat capable of within 5 seconds to about 30 seconds of heating the metal contacts or layer to a peak temperature of 520° C. to 580° C. from ambient temperature and cooling the metal contacts or layer to ambient temperature. Excellent examples of such heat sources are high intensity CW visual light lamps.

It was quite unexpectedly found that the aluminum alloy conductors on semiconductor devices thus treated showed the large crystals and the bamboo-like structure achieved in the much longer heating cycle employed in the method of the Pierce patent. Further the degree of suppression of electromigration and therefore the increase in lifetime was found to be at least equal to that provided by the use of the method of the Pierce patent.

The method of the invention may be applied to aluminum alloy conductors containing at least 90% by weight of aluminum.

In carrying out the invention a conductive layer of the aluminum alloy may be subjected to the heating-cooling cycle of the invention and the conductive patterns then formed or the conductive aluminum alloy patterns may first be formed and then subjected to the heating-cooling cycle of the invention.

DESCRIPTION OF THE PREFERRED EMBODIMENTS

While the method of the invention is useful for reducing electromigration in aluminum alloy conductors having an aluminum content of at least 10% by weight employed in semiconductor devices it has been found that the method of the invention is particularly useful for aluminum alloys containing up to 3% by weight of at least one element selected from the group consisting of silicon, copper, nickel, chromium and manganese.

Excellent results have been found, for example, when conductors formed of alloys of aluminum with up to 3% by weight of copper or with up to 2% by weight of copper and up to 1% by weight of silicon are employed in the method of the invention.

The aluminum alloy may be deposited on any of the substrates employed in the semiconductor and including silicon, silicon dioxide, germanium or III-V compounds such as gallium arsenide.

The aluminum containing alloys may be deposited as 0.25–5 um thick films by methods well known in the semiconductor art such as by evaporation or sputter deposition.

For deposition by evaporation a single electron beam gun may be employed and the deposition is deposited onto substrates heated to 200° C.–250° C. at a background pressure of $8 \times 10^{-7}$ Torr and at a rate of 28A/sec.

Sputter deposition may be carried out, for example, in a planar magnetron system at an argon pressure of $6 \times 10^{-3}$ Torr.

The resultant films may be subjected to the heating-cooling cycle of the invention and then patterned or the film first patterned and then subjected to the heating-cooling cycle of the invention. In either case patterning may be carried out by standard photolithographic and etching techniques. By these techniques conductor lines as narrow as 1 μm may be produced.

1 um thick films of a Al-1%Cu alloy were deposited on substrates of SiO$_2$ and Si. The deposition was carried out by an evaporation technique in which the substrates were heated to 200° C.–250° C., a single electron beam gun was used and deposition was carried out at a background pressure of $8 \times 10^{-7}$ torr and at a rate of 28A/sec.

1 μm thick films of an Al-1%Si-2%Cu alloy were also deposited on Si and SiO$_2$ substrates by sputtering in a planar magnetron system at an argon pressure of $6 \times 10^{-3}$ torr.

The resultant films were then patterned into 5, 10, 20 and 50 μm wide lines by use of standard photolithographic and etching techniques.

The resultant patterned wafers were annealed in the following manner:

The patterned wafers were positioned between two banks of high intensity visible light producing HEAT-PULSE 210M lamps and annealed employing the system as set out in U.S. Pat. No. 4,331,485. The duration of the annealing cycles varied from 5 to 60 seconds. The maximum temperatures achieved varied from 520° to 580° C.

Figure 1:
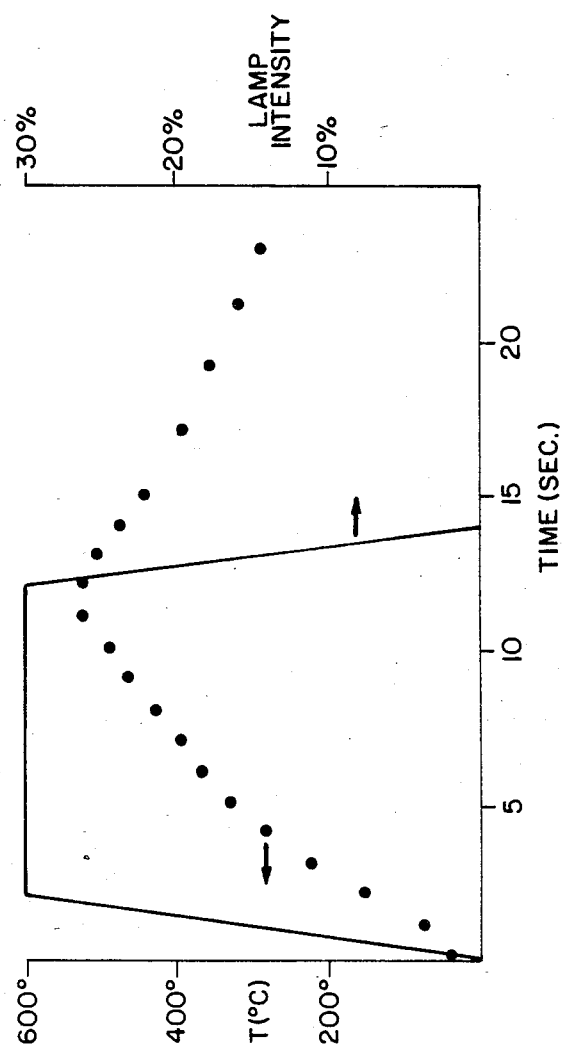
FIG. 1 is a graph showing a typical annealing cycle employed in the method of the invention.

An example of a temperature profile developed by use of these lamps is shown in FIG. 1 which is a graph showing the relationship of the intensity of the lamp, the duration of the annealing cycle and the temperature developed in the wafer. In the graph the duration of the annealing cycle is shown in seconds is shown in the abscissa and the temperature in ° C. developed in the wafer (as measured by a thermocouple attached to the patterned surface of the wafer) is shown in the left hand ordinate and the lamp intensity (in percentage of 20 kW) is shown in the right hand ordinate.

Specific examples of the application of the annealing method of the invention are shown in the following examples:

EXAMPLE 1

Substrate: Silicon wafer
Metal Thickness: 1 μm
Metal Composition Al+1%Si+2% Cu
Lamp Intensity: 30%
Time at Max. Intensity: 10 seconds
Ramp Up/Down Rate: 15° C./second
Maximum Temperature: 525° C.
Total Time: 14 seconds

EXAMPLE 2

Substrate: SiO$_2$
Metal Thickness: 0.75 μum
Metal Composition: Al+1%Cu
Lamp Intensity: 32%
Time at Max. Intensity: 10 seconds
Ramp Up/Down Rate: 15° C./second
Maximum Temperature: 550° C.
Total Time: 14 seconds

EXAMPLE 3

Figure 2:
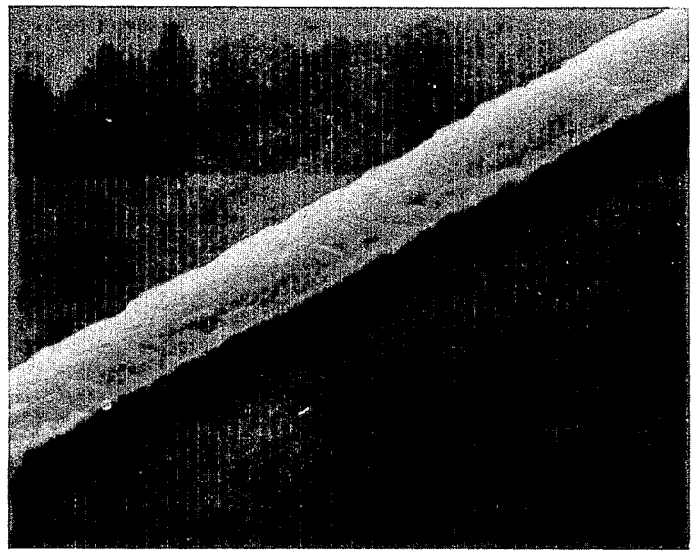
FIG. 2 is an enlarged view of a narrow aluminum alloy conductor before being subjected to the method of the invention showing several crystals with randomly oriented crystal grain boundaries.

Substrate: SiO$_2$
Metal Thickness: 0.75 μum
Metal Composition: Al+1%Cu
Lamp Intensity: 20%
Time at Max. Intensity: 30 seconds
Ramp Up/Down Rate: 15° C./second
Maximum Temperature: 520° C.
Total Time: 32.5 seconds A 1 μm thick film of a Al-1%Cu alloy was deposited on a SiO$_2$ layer by evaporation. The film was then patterned to form 10 μm wide conducting strips. A view of a section of one of these conductor strips (enlarged 2000 times) is shown in FIG. 2. As will be noted the strip is formed of randomly oriented crystals. As the grain boundaries are visible but difficult to see before the annealing treatment an accurate measurement of the grain sizes was made by preparing a cross-section for transmission electron microscopy (TEM). The mean grain size was found to be 2 um.

The patterned SiO$_2$ wafer was annealed according to the method of the invention. The peak temperature developed in the substrate was 525° C. and the duration of the annealing cycle was 14 seconds.

Figure 3:
FIG. 3 is an enlarged view of the aluminum alloy conductor of FIG. 1 after being treated according to the method of the invention showing the resultant large crystals formed into a "bamboo" like structure.

A view of a section of the resulting annealed conductor strip (enlarged 1500 times) is shown in FIG. 3. As shown, the conductor is formed of regularly oriented crystals arranged in a "bamboo" structure and having a mean grain size in excess of the 10 μm width of the conductor. Similar results were achieved when the sputter deposited material was Al-2%Cu1%Si alloy and was annealed according to the method of the invention.

In tests of the Al-1%Cu alloy conductors annealed according to the method of the invention, the median-time-to-failure under the condition of $2.9 \times 10^6 A/cm^2$ and 300° C. was 16 hours. The median-time-for-failure of the same material but annealed in a conventional oven was 3.7 hours.

What we claim is:

1. A method of providing a semiconductor device with aluminum containing conductors of improved electromigration resistance, said method comprising;
    (a) depositing, on a substrate of said device, a thin conductive layer of an alloy of aluminum containing at least 90% by weight of aluminum;

(b) heating said thus coated substrate to a peak temperature of 520° C.-580° C. from ambient temperature and then cooling said heated substrate to ambient temperatures all within a period of 5 seconds to about 30 seconds by exposing said coated substrate to a source of heat capable of raising the temperature of said coated substrate to said peak temperature from ambient temperature and then allowing said thus heated substrate to return to ambient temperature all within the same period and (c) forming a conductive pattern on said substrate by removing portions of said conductive layer from said substrate.

2. The method of claim 1 wherein the alloy of aluminum contains, in addition to the aluminum, up to 3% by weight in total of one or more of silicon, copper, nickel, chromium or manganese.

3. The method of claim 2 wherein the heat source is a high intensity CW lamp.

4. The method of claim 3 wherein the substrate is a material selected from the group consisting of silicon and silicon dioxide.

5. The method of claim 4 wherein the conductive layer is an alloy of aluminum with up to 3% by weight of copper.

6. The method of claim 4 wherein the conductive layer is an alloy of aluminum with up to 2% by weight of copper and up to 1% by weight of silicon.

7. The method of claim 5 wherein the substrate is silicon.

8. The method of claim 5 wherein the substrate is silicon dioxide.

9. A method of providing a semiconductive device with aluminum containing conductors of improved electromigration resistance said method comprising;
   (a) depositing on a substrate of said device a thin conductive layer of an alloy of aluminum with up to 3% by weight in total of one or more of silicon, copper, nickel, chromium or manganese,
   (b) forming a conductive pattern on said substrate by removing portions of said thin conductive layer from said substrate and
   (c) heating said thus patterned substrate to a peak temperature of 520° C.-580° C. from ambient temperature and then cooling said heated substrate to ambient temperatures all within a period of 5 seconds to about 30 seconds by exposing said coated substrate to a source of heat capable of raising the temperature of said coated substrate to said peak temperature from ambient temperature and then allowing said thus heated substrate to return to ambient temperature all within the same period.

10. The method of claim 9 wherein the heat source is a high intensity CW lamp.

11. The method of claim 10 wherein the substrate is a material selected from the group consisting of silicon and silicon dioxide.

12. The method of claim 11 wherein the aluminium containing conductive layer is a alloy of aluminum with up to 3% by way of copper 13. The method of claim 11 wherein the aluminum containing conductive layer is an alloy of aluminum with up to 2% by weight of copper and up to 1% by weight of silicon.

14. The method of claim 11 wherein the substrate is silicon.

15. The method of claim 11 wherein the substrate is silicon dioxide.

* * * * *